US011721569B2

(12) United States Patent
Myles et al.

(10) Patent No.: US 11,721,569 B2
(45) Date of Patent: Aug. 8, 2023

(54) METHOD AND APPARATUS FOR DETERMINING A POSITION OF A RING WITHIN A PROCESS KIT

(71) Applicant: Applied Materials, Inc., Santa Clara, CA (US)

(72) Inventors: Andrew Myles, Sunnyvale, CA (US); Andreas Schmid, Meyriez (CH); Phillip A. Criminale, Livermore, CA (US); Steven E. Babayan, Los Altos, CA (US)

(*) Notice: Subject to any disclaimer, the term of this patent is extended or adjusted under 35 U.S.C. 154(b) by 88 days.

(21) Appl. No.: 17/352,097

(22) Filed: Jun. 18, 2021

(65) Prior Publication Data

US 2022/0406635 A1    Dec. 22, 2022

(51) Int. Cl.
| | | |
|---|---|---|
| *H01L 21/67* | (2006.01) | |
| *G01B 11/27* | (2006.01) | |
| *G01B 9/02002* | (2022.01) | |
| *G05B 23/02* | (2006.01) | |
| *H01L 21/687* | (2006.01) | |

(52) U.S. Cl.
CPC .... *H01L 21/67259* (2013.01); *G01B 9/02002* (2013.01); *G01B 11/272* (2013.01); *G05B 23/0205* (2013.01); *H01L 21/68735* (2013.01)

(58) Field of Classification Search
CPC ... G01B 11/026; G01B 11/028; G01B 11/272; H01L 21/67259; H01L 21/68735; H01L 22/12
See application file for complete search history.

(56) References Cited

U.S. PATENT DOCUMENTS

| | | | |
|---|---|---|---|
| 6,592,673 B2 * | 7/2003 | Welch | H01L 21/67259 |
| | | | 118/728 |
| 2010/0196625 A1 | 8/2010 | Yoon et al. | |
| 2013/0093443 A1 | 4/2013 | Patrick | |
| 2016/0211166 A1 | 7/2016 | Yan et al. | |
| 2017/0133283 A1 | 5/2017 | Kenworthy | |

(Continued)

FOREIGN PATENT DOCUMENTS

| | | | | |
|---|---|---|---|---|
| JP | 2018186263 A | 11/2018 | | |
| JP | 2019192881 A * | 10/2019 | ........ | H01J 37/32091 |

(Continued)

OTHER PUBLICATIONS

International Search Report from PCT/US2022/028979 dated Sep. 7, 2022.

*Primary Examiner* — Michael A Lyons

(57) ABSTRACT

Examples disclosed herein are directed to a method and apparatus for determining a position of a ring within a process kit. In one example, a sensor assembly for a substrate processing chamber is provided. The sensor assembly includes a housing having a top surface, a bottom surface opposite the top surface, and a plurality of sidewalls connecting the top surface to the bottom surface. The housing also has a recess in the top surface, the recess forming an interior volume within the housing. The sensory assembly includes a bias member, and a contact member disposed on the bias member. The bias member and contact member are disposed within the recess. A sensor is configured to detect a displacement of the contact member. The displacement of the contact member corresponds to a relative position of an edge ring.

20 Claims, 5 Drawing Sheets

(56) References Cited

U.S. PATENT DOCUMENTS

| | | | |
|---|---|---|---|
| 2019/0326092 A1* | 10/2019 | Ogasawara | H01J 37/32091 |
| 2020/0273678 A1 | 8/2020 | Funk et al. | |
| 2020/0328105 A1* | 10/2020 | Sun | H01L 21/67069 |
| 2020/0335368 A1 | 10/2020 | Pan et al. | |
| 2020/0393242 A1 | 12/2020 | Vishwanath et al. | |
| 2021/0013014 A1 | 1/2021 | Sarode Vishwanath | |

FOREIGN PATENT DOCUMENTS

| | | | | |
|---|---|---|---|---|
| JP | 2020077653 A | * | 5/2020 | H01J 37/32091 |
| KR | 100783062 B1 | | 12/2007 | |
| WO | 2020180656 A1 | | 9/2020 | |
| WO | 2021173498 A1 | | 9/2021 | |

* cited by examiner

METHOD AND APPARATUS FOR DETERMINING A POSITION OF A RING WITHIN A PROCESS KIT

BACKGROUND

Field

Examples disclosed herein are directed to a method and apparatus for determining a position of a ring within a process kit.

Description of the Related Art

As semiconductor technology nodes advance with reduced size device geometries, substrate edge critical dimension uniformity requirements become more stringent and affect die yields. During deposition or etching, process kits containing multiple rings, are provided to favorably influence uniformity at the substrate perimeter or edge. A plasma sheath can bend at the substrate edge depending on the edge ring geometry, enabling ions to accelerate perpendicularly to the plasma sheath.

Routine maintenance requires that components exposed to the harsh plasma environment undergo periodic measuring and testing to determine whether the rings are in compliance with the original specifications, and require maintenance or replacement. Ensuring the replacement ring is in compliance with specification and in the correct position, requires the use of measuring and testing techniques. Conventional methods of determining a position of an edge ring include both mechanical and optical processes.

Non-contact techniques include using interferometry, in which light is projected to the surface of the process kit ring, and differences between an incident and refracted light are compared. When two light waves with the same frequency combine, the resulting intensity pattern is determined by the phase difference between the two waves. Destructive interference occurs when the light waves are out of phase. Additional conventional control methods include the use of mechanical measurements such as calipers or the use of a stylus. A stylus, for example, has a tip that is dragged in contact with the surface of the ring, and as the tip encounters peaks and valleys, the tip is raised and lowered in correspondence with a leveling of a ring with respect to the substrate support. The amount to which the stylus is raised or lowered at any given point corresponds to the compliance of the ring with the ring's original parameters.

A substrate resting on a substrate support may undergo a process that deposits material on the substrate and remove, or etch, portions of the material from the substrate, often in succession or in alternating processes. Process non-uniformities often exist across the surface of the substrate and may be significant at the perimeter or edge of the substrate, particularly when one of the rings of a process kit is not properly aligned. These non-uniformities at the perimeter may be attributable to undesirable electric field termination effects.

Accordingly, there is a need for an improved method and apparatus for indicating an edge ring position before and after maintenance or replacement.

SUMMARY

Examples disclosed herein are directed to a method and apparatus for determining a position of a ring within a process kit, such as an edge ring. In one example, a sensor assembly for a substrate processing chamber is provided. The sensor assembly includes a housing having a top surface, a bottom surface opposite the top surface, and a plurality of sidewalls connecting the top surface to the bottom surface. The housing also has a recess in the top surface, the recess forming an interior volume within the housing. The sensory assembly includes a bias member, and a contact member disposed on the bias member. The bias member and contact member are disposed within the recess. A sensor is configured to detect a displacement of the contact member. The displacement of the contact member corresponds to a relative position of an edge ring.

In another example, an edge ring metric measurement system is provided. The edge ring metric measurement system includes an edge ring disposed on a substrate support surface and a housing. The housing has a top surface, a bottom surface opposite the top surface, and a plurality of sidewalls connecting the top surface to the bottom surface. The housing further includes a recess in the top surface. The recess forms an interior volume within the housing. The edge ring metric measurement system includes a bias member and a contact member disposed on the bias member. The bias member and contact member are disposed within the recess. An alignment pin mechanically contacts the edge ring and the contact member. A light emitting sensor is configured to detect a displacement of the contact member. The displacement of the contact member corresponds to a metric of the edge ring.

Another example of the disclosure provides for a semiconductor processing system that includes a processing chamber configured to process a substrate. A non-transitory computer readable medium stores instructions that when executed by a processor cause a method to be performed in the processing chamber. The method includes receiving a signal at a sensor. The signal emanates below a substrate support surface configured to have an edge ring disposed thereon. The edge ring is configured to circumscribe the substrate. The method further includes detecting a displacement of the edge ring, and calculating a metric of the edge ring based upon the displacement. The method also includes performing a maintenance operation on the edge ring in response to the metric.

For clarity, identical reference numerals have been used, where applicable, to designate identical elements that are common between figures. Additionally, elements of one example may be advantageously adapted for utilization in other examples described herein.

BRIEF DESCRIPTION OF THE DRAWINGS

So that the manner in which the above recited features of the present disclosure can be understood in detail, a more particular description of the disclosure, briefly summarized above, may be had by reference to examples, some of which are illustrated in the appended drawings. It is to be noted, however, that the appended drawings illustrate only exemplary examples and are therefore not to be considered limiting of its scope, and may admit to other equally effective examples.

To facilitate understanding, identical reference numerals have been used, where possible, to designate identical elements that are common to the figures. It is contemplated that elements and features of one example may be beneficially incorporated in other examples without further recitation.

DETAILED DESCRIPTION

Figure 1:
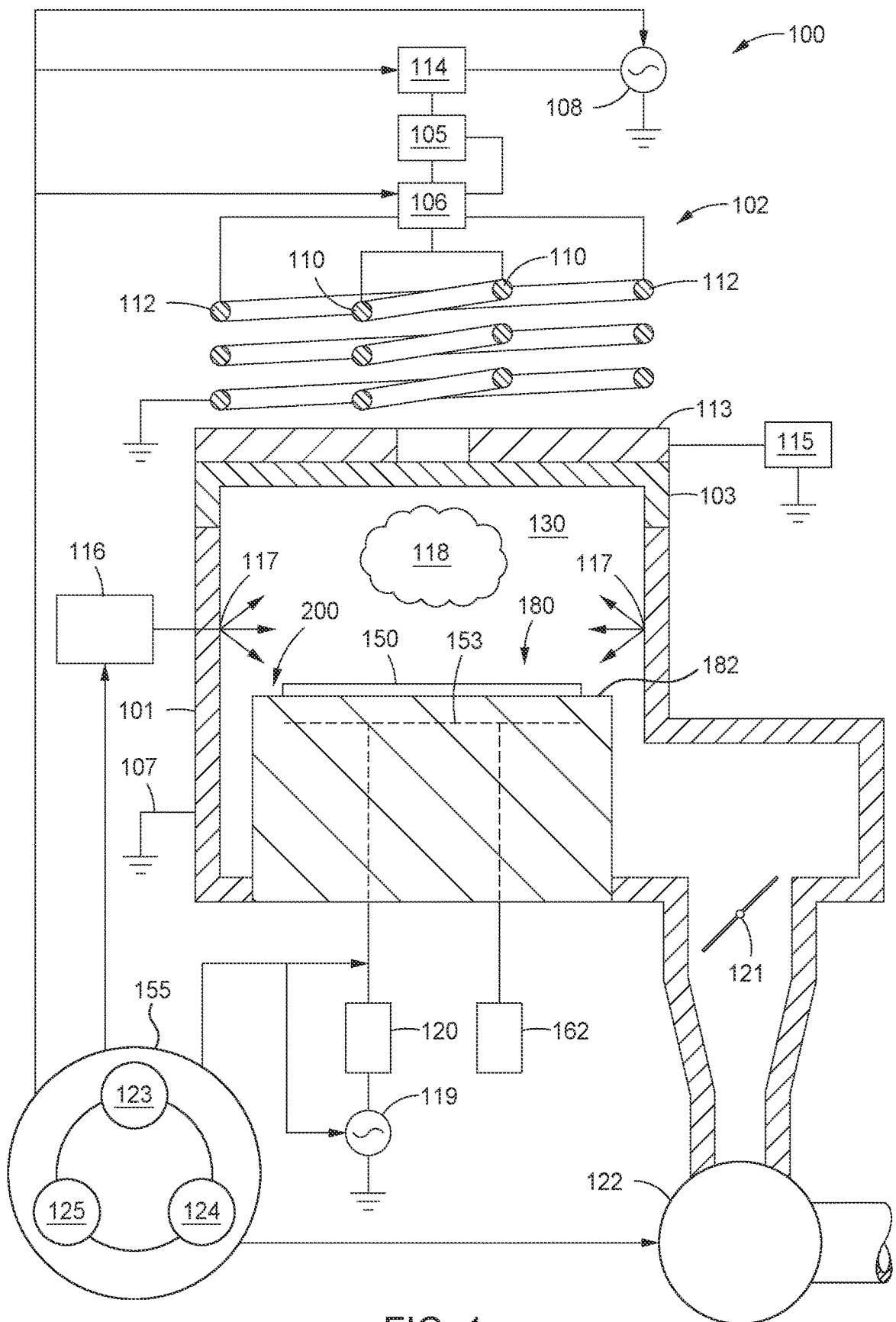
FIG. 1 is a schematic cross-sectional view of a processing chamber having substrate support assembly.

Examples disclosed herein are directed to a method and apparatus for determining a position of a ring within a process kit. The method and apparatus disclosed herein enable a position of a process kit ring to be determined when the ring is hidden from direct optical monitoring and space available for a sensor is limited. A process kit can include several rings, including one or more edge rings proximate an edge of a substrate support surface, one or more tuning rings that are below and in physical contact with the edge ring, and sliding rings proximate the tuning ring or edge ring. Over multiple process runs, debris from the substrate, process kits, or other chamber components can build-up and affix to surfaces of one or more rings of the process kit. During maintenance, when one of the rings is removed, replaced, or repositioned, the built-up debris can cause the tuning ring or edge ring to become wedged between adjacent rings or surfaces of the process chamber. The wedging of process kit rings can cause the edge ring to become unleveled with the substrate support, adversely affecting the plasma sheath.

The method and apparatus disclosed herein utilizes an alignment apparatus to monitor a position of the measured ring within the process kit. The alignment apparatus includes an alignment pin, a sensor, a housing having a transparent window, a bias member, and a contact member (e.g., a disc) configured to contact the alignment pin. The alignment pin is in contact with the tuning ring, and the tuning ring is in contact with one or more of the edge rings. Any one of the process kit rings can become wedged against another ring of the process kit, causing the ring to become tilted upward, when the alignment pin is retracted away from the substrate surface. Conventional methods and apparatuses for determining a position of the edge ring, include utilizing a camera, laser, or sensor to determine the position of the edge ring through a window in the processing chamber. However, the conventional approach requires a line of sight between a sensor and the desired ring of the process kit, thus limiting the tools available for determining edge ring position. In addition, plasma and RF frequencies within the chamber interfere with sensor readings, thus requiring additional devices and methods to remove noise from the collected signals.

Therefore, the method and apparatus disclosed herein uses a laser to determine a deflection of a contact member (i.e., a disk) coupled to the alignment pin, which enables determination of a position of one or more process kit rings. In one example, the utilization of the method and apparatus disclosed herein, along with a force sensor or torque motor and screw, a weight of the edge ring can be determined. Advantageously, replacement and servicing of the alignment pin is simplified, because the alignment pin can be removed through a hole in the process kit without the need to remove the substrate support. Moreover, the size of the hole through which the alignment pin is passed remains small enough to substantially prevent arcing that may damage other process chamber components. One advantage to placing the sensor outside the processing chamber is that signal strength and quality are maintained. As such, interference from the electromagnetic waves and high temperatures inside the processing chamber do not reduce the reliability of the sensor measurements by introducing distorted sensor signals.

FIG. 1 a schematic cross-sectional view of the processing chamber 100 having the substrate support assembly 180, according to one example. As shown, the processing chamber 100 is an etch chamber suitable for etching a substrate 150. Examples of processing chambers that may be adapted to benefit from the disclosure are Sym3® Processing Chamber, C3® Processing Chamber, and Mesa™ Processing Chamber, commercially available from Applied Materials, Inc., located in Santa Clara, Calif. It is contemplated that other processing chamber, including deposition chambers and those from other manufacturers, may be adapted to benefit from the disclosure.

The processing chamber 100 includes a chamber body 101 and a lid 103 disposed thereon that together define an interior volume 130. The chamber body 101 is coupled to an electrical ground 107. A substrate support assembly 180 is disposed within the interior volume 130 to support the substrate 150 thereon during processing. The processing chamber 100 also includes an inductively coupled plasma apparatus 102 for generating a plasma within the processing chamber 100. A controller 155 is adapted to control the processing chamber 100.

The substrate support assembly 180 includes one or more electrodes 153 coupled to a bias source 119 through a matching network 120 to facilitate biasing of the substrate 150 during processing. The bias source 119 may illustratively be a source of up to about 1,000 W (but not limited to about 1,000 W) of RF energy at a frequency of, for example, approximately 13.56 MHz, although other frequencies and powers may be provided as desired for particular applications. The bias source 119 may be capable of producing either or both of continuous or pulsed power. In some examples, the bias source 119 may be a DC or pulsed DC source. In some examples, the bias source 119 may be capable of providing multiple frequencies. The one or more electrodes 153 may be coupled to a chucking power source 162 to facilitate chucking of the substrate 150 during processing.

The inductively coupled plasma apparatus 102 is disposed above the lid 103 and is configured to inductively couple RF power into the processing chamber 100 to generate a plasma within the processing chamber 100. The inductively coupled plasma apparatus 102 includes first and second coils 110, 112, disposed above the lid 103. The relative position, ratio of diameters of each coil 110, 112, and/or the number of turns in each coil 110, 112 can each be adjusted as desired to control the profile or density of the plasma being formed. Each of the first and second coils 110, 112 is coupled to an RF power supply 108 through a matching network 114 via an RF feed structure 106. The RF power supply 108 may illustratively be capable of producing up to about 4,000 W (but not limited to about 4,000 W) at a tunable frequency in a range from 50 kHz to 13.56 MHz, although other frequencies and powers may be utilized as desired for particular applications. In some examples, a power divider 105, such as a dividing capacitor, may be provided between the RF feed structure 106 and the RF power supply 108 to control the relative quantity of RF power provided to the respective first and second coils 110, 112. In some examples, the power divider 105 may be incorporated into the matching network 114.

A heater element 113 may be disposed atop the lid 103 to facilitate heating the interior of the processing chamber 100. The heater element 113 may be disposed between the lid 103 and the first and second coils 110, 112. In some examples, the heater element 113 may include a resistive heating element and may be coupled to a power supply 115, such as an AC power supply, configured to provide sufficient energy to control the temperature of the heater element 113 within a desired range.

During operation, the substrate 150, such as a semiconductor wafer or other substrate suitable for plasma processing, is placed on a substrate support surface 182 of the substrate support assembly 180. Process gases are supplied from a gas panel 116 through entry ports 117 into the interior volume 130 of the chamber body 101. The process gases are ignited into a plasma 118 in the processing chamber 100 by applying power from the RF power supply 108 to the first and second coils 110, 112. In some examples, power from a bias source 119, such as an RF or DC source, may also be provided through a matching network 120 to electrodes 153 within the substrate support assembly 180. The pressure within the interior of the processing chamber 100 may be controlled using a valve 121 and a vacuum pump 122. The temperature of the chamber body 101 may be controlled using liquid-containing conduits (not shown) that run through the chamber body 101.

The processing chamber 100 may be used for various plasma processes. In one example, the processing chamber 100 may be used to perform dry etching with one or more etching agents. For example, the processing chamber 100 may be used for ignition of plasma from one or more precursors or process gases, such as one or more fluorocarbons (e.g., $CF_4$ or $C_2F_6$), $O_2$, $NF_3$, $N_2$, Ar, He, or combinations thereof.

The processing chamber 100 includes the controller 155 to control the operation of the processing chamber 100 during processing. The controller 155 can include a processor 123, memory 124, and support circuits 125 for the processor 123 and facilitates control of the components of the processing chamber 100. The controller 155 may be one of any form of general-purpose computer processor that can be used in an industrial setting for controlling various chambers and sub-processors. The memory 124 stores software (source or object code) that may be executed or invoked to control the operation of the processing chamber 100 in the manner described herein. The memory 124 is non-transitory and may be one or more of readily available memory such as random access memory (RAM), read only memory (ROM), or any other form of digital storage, local or remote. The memory 124 contains instructions, that when executed by the processor 123, facilitates execution of the method 500 (shown in FIG. 5).

To facilitate control of the processing chamber 100, the processor 123 may be one of any form of general purpose computer processor, or a general purpose central processing unit (CPU), each of which can be used in an industrial setting, such as a programmable logic controller (PLC), for controlling various chambers and sub-processors. The memory 124 is coupled to the processor 123 and the memory 124 is non-transitory and may be one or more of readily available memory such as random access memory (RAM), read only memory (ROM), floppy disk drive, hard disk, or any other form of digital storage, local or remote. Support circuits 125 are coupled to the processor 123 for supporting the processor in a conventional manner. Charged species generation, heating, and other processes are generally stored in the memory 124, typically as software routine. The software routine may also be stored and/or executed by a second CPU (not shown) that is remotely located from the processing chamber 100 being controlled by the processor 123.

The memory 124 is in the form of computer-readable storage media that contains instructions, that when executed by the processor 123, facilitates the operation of the processing chamber 100. The instructions in the memory 124 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the examples (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are examples of the present disclosure.

Figure 2:
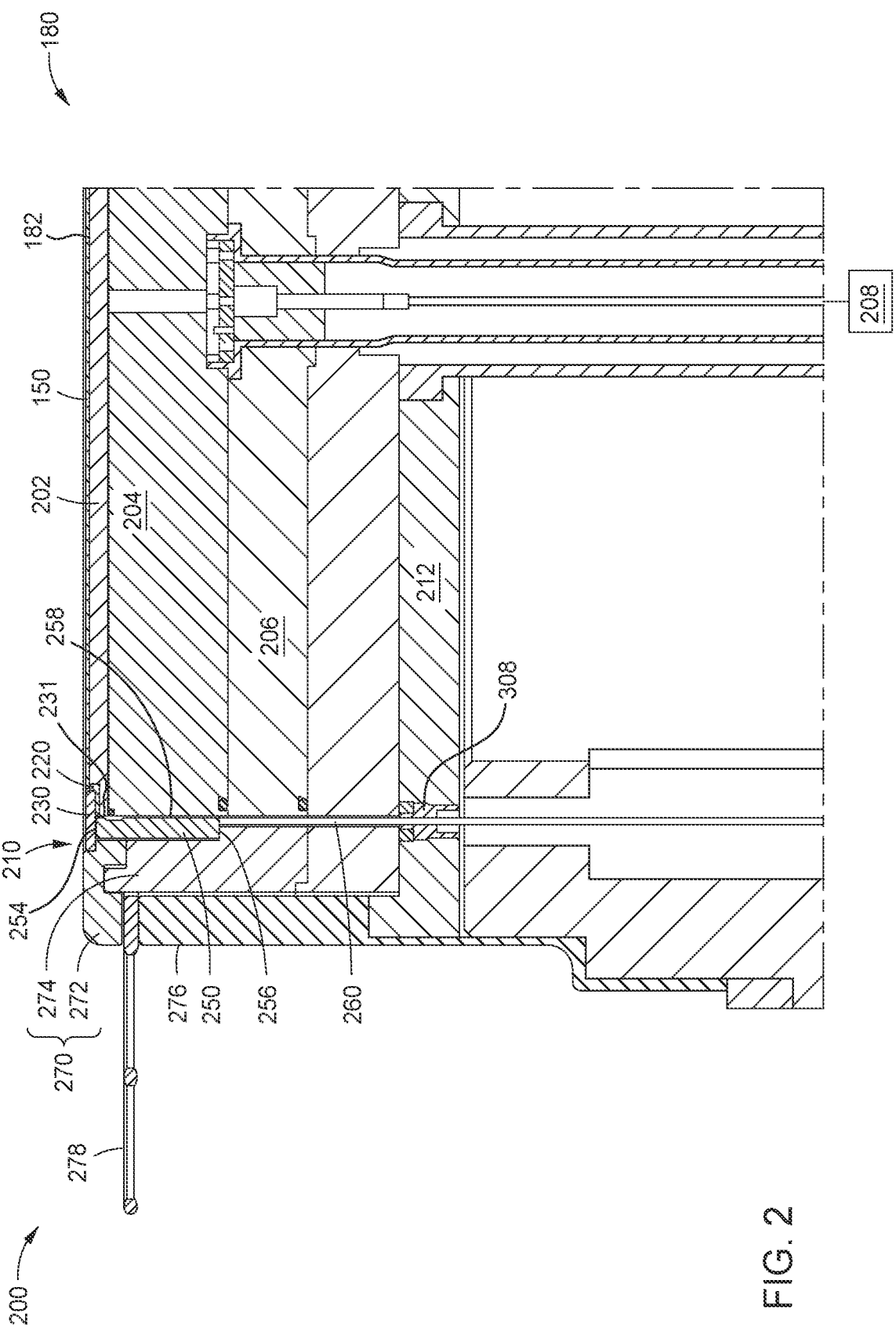
FIG. 2 illustrates an enlarged partial cross-sectional view of a process kit disposed on the substrate support assembly in the processing chamber of FIG. 1.

FIG. 2 illustrates an enlarged partial cross-sectional view of a process kit 200 disposed on the substrate support assembly 180 in the processing chamber 100 of FIG. 1. The processing chamber 100 also includes the process kit 200 disposed in the interior volume 130, such as on the substrate support assembly 180. The process kit 200 is used during plasma processing of the substrate 150.

The substrate support assembly 180 includes an electrostatic chuck (ESC) 202, a cooling plate (or cathode) 204, a base 206, and a cathode stack 212. The cooling plate 204 is disposed on the base 206. The cooling plate 204 may include a plurality of cooling channels (not shown) for circulating coolant therethrough. The cooling plate 204 may be engaged with or bonded to the electrostatic chuck 202 by an adhesive or other suitable mechanism. One or more power supplies 208 may be coupled to the cooling plate 204. The power supplies can be or include sources and/or feeds for radio frequency (RF), alternating current (AC), and/or direct current (DC). The electrostatic chuck 202 may include one or more heaters (not shown). The one or more heaters may independently be controllable. The one or more heaters enable the electrostatic chuck 202 to heat the substrate 150 to a desired temperature.

The process kit 200 includes an edge ring 210 that has a first ring component 220 and a second ring component 230, each forming an annular body. Accordingly, the edge ring 210 is one ring of the process kit 200 that includes a plurality of rings, e.g., the first ring component 220 and the second component 230. Additionally, the edge ring 210 is completely or partially disposed on the substrate support surface 182. The first ring component 220 and the second ring component 230 can independently be made from or include one or more electrically insulting materials, such as silicon carbide, silicon oxide, quartz, or any combination thereof. The two ring components 220, 230 are interfaced with each other such that the second ring component 230 is movable relative to the first ring component 220. A height of the first ring component 220 is substantially the same as a height of the electrostatic chuck 202. As such, the first ring component 220 protects a side of the electrostatic chuck 202. In some examples, the substrate 150, when positioned on the electrostatic chuck 202, extends partially over a portion of the first ring component 220.

The process kit 200 further includes an adjustable tuning ring 250 having an upper surface 254 and a lower surface 256. The adjustable tuning ring 250 may be formed from or otherwise include one or more electrically conductive materials. For example, the electrically conductive material can be or include aluminum or one or more aluminum alloys. The adjustable tuning ring 250 is disposed beneath the edge ring 210. For example, the adjustable tuning ring 250 is disposed beneath the second ring component 230. The adjustable tuning ring 250 contacts the lower surface of the 231 of the second ring component 230. In one example, the adjustable tuning ring 250 extends down the length of the electrostatic chuck 202 and the cooling plate 204, such that the adjustable tuning ring 250 has a height substantially equal to the combined heights of the electrostatic chuck 202 and the cooling plate 204. As such, the adjustable tuning ring 250 is able to couple power from the cooling plate 204 to the edge ring 210.

The adjustable tuning ring 250 may circumscribe the cooling plate 204, thus forming a laterally spaced gap 258 therebetween. In one example, the laterally spaced gap 258 has a width of greater than 0 inches and less than or equal to 0.03 inches. In other examples, the laterally spaced gap 258 was a width of about 0.005 inches, about 0.007 inches, or about 0.009 inches to about 0.0010 inches, about 0.0013 inches, about 0.0015 inches, or about 0.0019 inches. For example, the laterally spaced gap 258 has a width of about 0.007 inches to about 0.0015 inches. The adjustable tuning ring 250 interfaces with an alignment pin 260. Accordingly, the alignment pin 260 mechanically contacts the adjustable tuning ring 250.

The process kit 200 also includes a cover ring assembly 270, an annular body 276, and a plasma screen 278 disposed at least partially therebetween. The cover ring assembly 270 has an annular shape and includes a cover ring 272 and a sleeve 274. The cover ring 272 and the sleeve 274 can independently be made from or include quartz material or other plasma resistant material. For example, the cover ring 272 can be a quartz ring and the sleeve 274 can be a quartz pipe.

Figure 3:
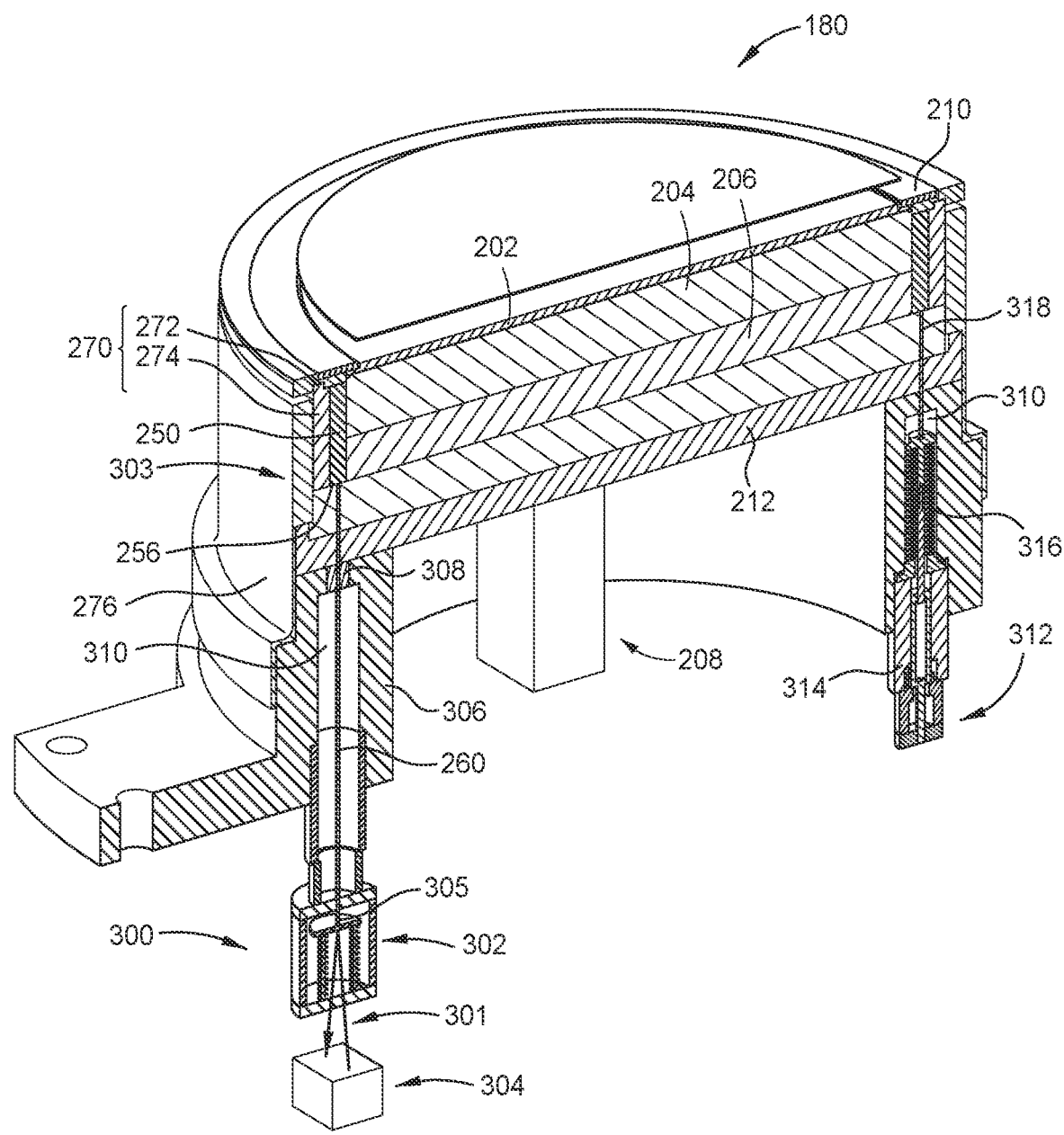
FIG. 3 illustrates an alignment assembly configured to obtain the metric of a ring of the process kit, shown in FIG. 2.

FIG. 3 illustrates an alignment assembly 300 configured to obtain a metric of a ring of the process kit 200, such as the edge ring 210. In one example, the metric obtained by the alignment assembly 300 is a weight of the edge ring 210. The alignment assembly 300 includes a housing 302, a sensor 304 disposed beneath the housing 302, and the alignment pin 260 extending into the housing 302. The sensor 304 is configured to emit and receive a light beam 301. The alignment assembly 300 is coupled to a chassis 306 of the substrate support assembly 180. A hole 310 is provided in the chassis 306 that enables the alignment pin 260 to extend through the chassis 306 without interference. A guide 308 may be disposed in the hole 310 to provide a bearing surface that promotes axial movement while preventing play, or horizontal movement, of the alignment pin 260. While one alignment assembly 300 is illustrated, it is contemplated that up to three alignment assemblies 300 can be disposed at 120 degrees apart, around the substrate support assembly 180.

The light beam 301 of sensor 304 has a frequency from about 500 nm to about 1000 nm, in one example. A beam diameter of the light beam 301 can be from about 25 to about 75 micrometers. In another example, the light beam 301 can have a light frequency from about 600 nm to about 750 nm. Exemplary frequencies include, but are not limited to, a frequency of about 550 nm, about 650 nm, about 700 nm, and about 750 nm. The sensor 304 is configured to emit the light beam 301 and detect the return of the light beam 301. As such, the sensor 304 is enabled to determine a distance the light beam 301 has traversed. For example, the sensor 304 can detect time of flight of the light beam 301. The alignment pin 260 has an upper end 303 that contacts the lower surface 256 of the adjustable tuning ring 250. A lower end 305 of the alignment pin 260 is configured to displace a bias member 424 shown in FIG. 4.

A lift assembly 312 is disposed in the substrate support assembly 180. In one example, the lift assembly 312 is configured to move the edge ring 210 (shown in FIG. 2) between a raised and a lowered position. In the lowered position, the edge ring 210 may be partially disposed on the cover ring assembly 270 or near to the cover ring assembly 270. As noted, the edge ring 210 may also be fully or partially disposed on the substrate support surface 182. The lift assembly 312 is a mechanism to precisely control the height of the edge ring 210 over the substrate 150 resulting in control of the plasma sheath and etch profile at the extreme edge of the substrate 150. While one lift assembly 312 is shown, it is understood that the substrate support assembly 180 has three lift assemblies 312 disposed within the substrate support assembly 180, each capable of balancing and moving the edge ring 210. The lift assembly 312 has a motor 314, bellows 316, and a lift pin 318. Each lift assembly 312 can be disposed about 120 degrees apart. In another example, the lift assembly 312 is configured to move a shadow ring (not shown) between a raised and a lowered position. The shadow ring is configured to overlay the edge ring 210.

The motor 314 is operable to move the lift pin 318 upwards and downwards between a raised and lowered position. The motor 314 may be a linear actuator, pneumatic, hydraulic, stepper, servo, gear or other suitable motor for providing vertical displacement of the lift pin 318. The motor 314 may be configured with a hard stop as well as an optical encoder for determining the stroke or movement of the lift pin 318. The optical encoder is configured to provide feedback to the controller for a precise vertical location of the lift pin 318. The optical encoder allows precise control of the motor 314 for positioning a shadow ring (not shown) overlaying the cover ring assembly 270, which is supported by the lift pin 318. In one example, the bellows 316 is configured to accommodate two-inch (2") or greater vertical movement of the lift pin 318. The bellows 316 maintains an airtight seal around the lift pin 318, allowing the lift pin 318 to move up and down while the interior of the processing chamber 100 remains at vacuum pressure.

The lift assembly 312 is coupled to the chassis 306. The hole 310 is provided in the chassis 306 for clearance of the lift pin 318 to extend through the chassis 306 without interference. The guide 308 promotes axial movement of the lift pin 318. The guide 308 may be a bushing preventing wobble or play of the lift pin 318. The guide 308 may be formed from ceramic material having an inner diameter for accommodating axial motion of the lift pin 318 through the guide 308.

Figure 4:
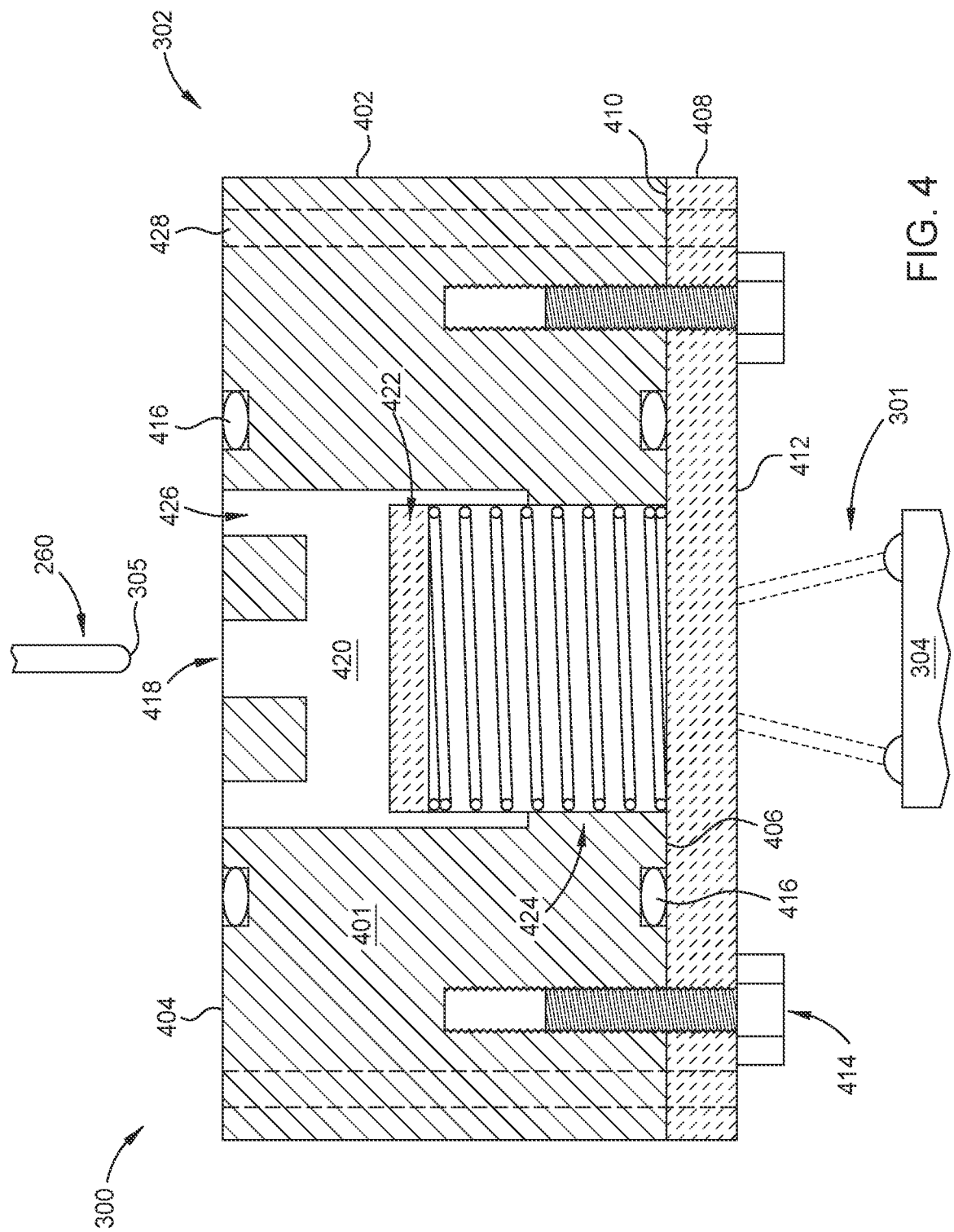
FIG. 4 is a cross-section view of the alignment assembly showing details of an alignment assembly housing.

FIG. 4 is a cross-section view of the alignment assembly 300 showing details of the housing 302. The housing 302 includes a body 401, a top surface 404, a bottom surface 406 opposite the top surface 404, and sidewalls 402 connecting the top surface 404 and the bottom surface 406. A transparent window 408 has a top surface 410 and a bottom surface 412. A plurality of fasteners 414 pass through holes in the transparent window 408 into the body 401 of the housing 302, securing the transparent window 408 to the housing 302. The fasteners 414 pass through the bottom surface 406 of the body 401, but do not extend through the top surface 404. An O-ring 416 can be recessed within the body 401 between the bottom surface 406 of the housing 302 and the top surface 410 of the transparent window 408.

In one example, the transparent window 408 is made of a transparent ceramic, or a transparent crystal. For example, the transparent window 408 can be made from plastic, glass, or sapphire. The housing 302 may be made from a ceramic, metal, or a composite material. In one example, the housing 302 is made from a material that includes aluminum.

An alignment hole 418 is disposed in the top surface 404 of the body 401. The alignment hole 418 is disposed in a center of the body 401. The alignment hole 418 enables the alignment pin 260 to contact a contact member 422. The lower end 305 of the alignment pin 260 contacts the contact member 422. The contact member 422 and bias member 424 are disposed within a recess 420 of the body 401. The recess 420 extends through the top surface 404. Vent passages 426 are equidistantly and radially disposed from the alignment hole 418. Vent passages 426 enable air within the recess 420 to pass through the top surface 404 of the body 401. The bias member 424 is seated within the recess 420, such that the bias member 424 is between the contact member 422 and the transparent window 408. The bias member 424 abuts the transparent window 408. The bias member 424 and contact member 422 are dimensioned such that the light beam 301 can travel unimpeded between the sensor 304 and the contact member 422. For example, a diameter and height of the bias member 424 and contact member 422 are configured to fit within the recess 420 while enabling the light beam 301 to pass through the transparent window 408, strike the contact member 422, and return to the sensor 304 unobstructed by the bias member 424, the contact member 422 or internal surfaces of the body 401.

As the contact member 422 is biased towards the bottom surface 406 vent passages 426 prevent adverse pressure build-up or pressure drops within the recess 420. The vent passages 426 also enable air to enter the recess 420 as the contact member 422 is biased toward the top surface 404 returning to a steady state position. Accordingly, the vent passages 426 and recess 420 are fluidically coupled to the processing chamber 100. Fluidically coupling the vent passages 426 and recess 420 to processing chamber 100 substantially reduces pressure changes within the recess 420 that would otherwise add an undesirable force component to the bias member 424, thus contributing to an error relative to a true displacement of the contact member 422. Moreover, the vent passages 426 enable the recess 420 to have a same pressure as the processing chamber 100.

In one example, the bias member 424 has a spring constant greater than 2.75 lbs/in and less than 5.0 lbs/in. In another example, the bias member 424 has a spring constant between about 2.5 lbs/in and about 4.5 lbs/in, such as between about 3.0 lbs/in or about 4.0 lbs. in. Exemplary spring constants include a spring constant of about 2.75 lbs/in, about 3.0 lbs/in, and about 3.25 lbs/in.

Through-holes 428 extending through the body 401 align with through-holes 428 extending through the transparent window 408. Through-holes 428 enable the housing 302 to be coupled to the processing chamber through fasteners, similar to the fasteners 414. The through-holes 428 also enable the sensor 304 to be mechanically coupled to the housing 302. The sensor 304 shown in FIGS. 3 and 4 is not shown mechanically coupled to the housing 302 in order to show details of the alignment assembly 300. However, it is understood that in one example, the sensor 304 and the housing 302 are arranged such that relative movement between the sensor 304 and housing 302 is fixed. As such, in one example, the sensor 304 is fixed to the housing 302. In another example, the sensor 304 is not directly fixed to the housing 302, but can be affixed to the chamber body 101 adjacent to the sensor 304.

Figure 5:
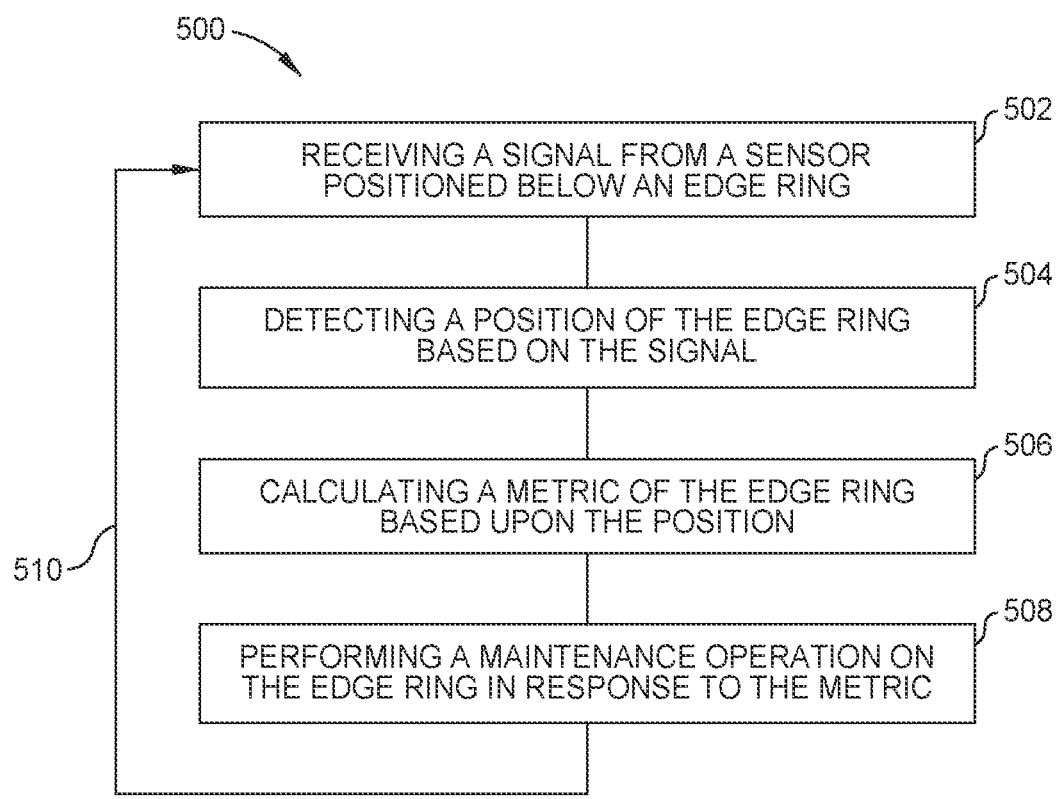
FIG. 5 is a flow chart of a method of measuring the edge ring metric with the alignment assembly, illustrated in FIGS. 3-4.

FIG. 5 is a flow chart of a method 500 of measuring a metric of an edge ring with the alignment assembly 300. The method 500 enables determination of a position of the process kit by measuring the displacement of a disc, such as the contact member 422, which is mechanically coupled to the process kit. Accordingly, the method 500 is configured to determine if an edge ring of the process kit is skewed, i.e., whether the edge ring's position relative to the substrate support is within specification parameters. Alternatively, or in addition, the method 500 enables determination of edge ring wear, based upon a height of the edge ring relative to the substrate support.

At operation 502 a signal is received from a sensor that is positioned below an edge ring. The sensor can be a light emitting sensor, such as the sensor 304. The sensor is positioned at one end of an alignment pin. The other end of the alignment pin mechanically contacts the edge ring and is configured to move the edge ring in a vertical direction, relative to a substrate support surface. For example, the sensor 304 is placed proximate a lower end 305 of the alignment pin 260. The upper end 303 of the alignment pin 260 contacts the lower surface 231 of the adjustable tuning ring 250. The edge ring 210, including the first ring component 220 and the second ring component 230, is disposed on top of the adjustable tuning ring 250. The sensor 304 is positioned beneath each of the adjustable tuning ring 250 and the edge ring 210, including the first ring component 220 and the second ring component 230.

At operation 504 a position of the edge ring is determined based on the signal received from the sensor. The alignment pin mechanically contacts a bias member disposed within a housing. The alignment pin is coupled to the bias member through a contact member, such that the contact member is disposed between the bias member and the alignment pin. A load on the alignment pin causes the contact member to move in the direction of gravity. The load on the alignment pin includes the weight of the edge ring, and any intervening rings between the sensor and the edge ring, such as a tuning ring. For example, the load on the alignment pin 260 includes a weight of the edge ring 210, including the first ring component 220 and the second ring component 230, and the adjustable tuning ring 250.

The relative displacement of the contact member corresponds to the load on the lift pin. Thus, a position of the edge ring relative to the substrate support surface corresponds to the relative displacement of the contact member. As noted, the sensor detects the relative movement of the contact member. Because the contact member is mechanically coupled to the edge ring, the sensor is able to determine a displacement of the edge ring and/or tuning ring.

The method 500 proceeds to operation 506 where a metric of the edge ring is calculated based upon the displacement of the alignment pin. In one example, the displacement of the alignment pin is used to calculate a position of the edge ring relative to the substrate support surface. The alignment pin mechanically contacts the edge ring such that the load on the alignment pin includes the weight of the edge ring(s), as noted above. A position of the contact member is calibrated such that when a top surface of the edge ring is substantially parallel to the substrate support surface, the sensor detects zero displacement of the contact member. Zero displacement of the contact member corresponds to a ring, such as the edge ring, which is level with respect to the substrate support. As such, a negative displacement of the contact member corresponds to an edge ring that is too low relative to the substrate support surface, and a positive displacement of the contact member corresponds to an edge ring that is too high relative to the substrate support surface.

In one non-limiting example, the sensor 304 receives a light beam 301 reflected from the contact member 422. The sensor 304 is configured to determine a distance the light beam 301 has traversed, which corresponds to a displacement of the contact member 422. A time of flight of the light beam 301 is determined, which corresponds to the displacement of the contact member 422. The displacement of the contact member can also be determined by measuring the time of flight $t_{of}$ of the a light beam 301 as it travels round trip from the sensor 304 to contact member 422, and back to the sensor 304. A time of flight is expressed by the equation $t_{of}=2d/v$. The variable t represents the time of flight, v represents the velocity of the light beam 301, and d represents the distance between the sensor 304 and the contact member 422. The light beam 301 is detected at the sensor 304, and is transmitted to the controller 155 as a signal. The controller 155 having a program installed thereon, calculates a position of the contact member 422, which corresponds to the displacement of the alignment pin 260.

In another example, the metric calculated corresponds to an erosion of the edge ring. As noted, the sensor 304 detects the relative position of the edge ring 210 with respect to the substrate support surface 182 based upon the displacement of the contact member 422. Therefore, as the edge ring 210 erodes, the load on the alignment pin 260 decreases in proportion to a decreasing weight of the eroding edge ring 210. By monitoring the load of the edge ring 210 over a period of time, the rate of erosion as well as an absolute erosion can be calculated, i.e., a metric corresponding to a weight loss of the edge ring 210.

For example, a force sensor (not shown) can be coupled to a moveable part of the alignment assembly 300 in order to measure mass of the process kit. A mechanical force, such as load or weight of the edge ring, is converted into a measureable electrical signal. As the force applied to the force sensor by the edge ring increases or decreases, the electrical signal changes proportionally. As the edge ring erodes, the mechanical force applied to the force sensor decreases, as does the electrical signal output from the force sensor. The electrical signal corresponds to a wear or deterioration of the edge ring.

Alternatively, a torque motor (not shown) and a screw (e.g., the alignment pin 260) are calibrated to detect a weight of the edge ring. The torque motor and screw are coupled to the process kit, the screw contacting a ring of the process kit. The screw is configured to vertically move with the edge ring, as the weight of the edge ring changes. The force needed to move the process kit is converted to an electrical signal. An encoder, such as an optical encoder, is configured to provide feedback to the controller for a precise vertical location of the screw. The optical encoder can be coupled to the torque motor, in one example. The electrical signal includes the force required to overcome the inertia of the screw from a rest position to moving the edge ring. A signal corresponding to the weight of the edge ring, subtracts the inertia and any noise related to friction or inherent to the encoder or controller within the electrical signal.

The method continues to operation 508, where a maintenance operation is performed on the edge ring in response to the calculated metric. The maintenance operation may be performed on the adjustable tuning ring. For example, during routine maintenance the edge ring or adjustable tuning ring may be moved or replaced. A position of a replacement edge ring should be calibrated such that the replacement edge ring is substantially parallel to the substrate support surface. However, undesirable materials can build-up within the processing chamber causing the adjustable tuning ring or other components to become wedged within the substrate support assembly. Accordingly, when the replacement edge ring is not in the correct position, the adjustable tuning ring can be readjusted thus enabling the replacement edge ring to become substantially parallel to the substrate support surface. In another example, the adjustable tuning ring is removed and cleaned. If the adjustable tuning ring conforms to specifications, the adjustable tuning ring is again repositioned within the substrate support. In one example, a vertical height of the ring is adjusted, such as a vertical height of the edge ring or adjustable tuning ring with respect to the substrate support surface. Where the adjustable tuning ring no longer conforms to specification, the adjustable tuning ring is replaced.

In another example, the maintenance performed at operation 508 is in response to a load or weight of a process kit ring, such as the edge ring. As noted, the sensor is able to detect the weight of the edge ring. As such, when the edge ring erodes, the weight of the edge ring decreases and the corresponding amount of erosion is detected by the controller. The controller calculates the amount of erosion based upon the weight of the edge ring. When the weight of the edge ring reaches a threshold minimum, a signal or alarm is produced by the controller to alert an operator that the edge ring should be replaced. Accordingly, the edge ring is removed and a replacement edge ring is installed.

At operation 510, the method 500 returns to operation 502 and the method 500 continues. In one example, the operation 502 proceeds when an edge ring or a tuning ring is replaced. In another example, operation 502 proceeds at a routine maintenance time. And, in yet another example, operations 502, 504, and 506 can proceed for a predetermined amount of time, or until a threshold erosion of the edge ring is determined.

Examples disclosed herein are directed to a method and apparatus for determining a position of a ring within a process kit. Advantageously, the method and apparatus disclosed enable a ring position to be determined when the ring is obscured from direct optical monitoring. While the foregoing is directed to specific examples, other examples may be devised without departing from the basic scope thereof, and the scope thereof is determined by the claims that follow.

What we claim is:
1. A sensor assembly for a substrate processing chamber, comprising:
  a housing having a top surface, a bottom surface opposite the top surface, and a plurality of sidewalls connecting the top surface to the bottom surface, the housing further comprising a recess in the top surface, the recess forming an interior volume within the housing;
  a bias member;

a contact member disposed on the bias member, wherein the bias member and contact member are disposed within the recess; and a sensor configured to detect a displacement of the contact member, the displacement of the contact member corresponding to a relative position of an edge ring.

2. The sensor assembly of claim 1, wherein the sensor is a light emitting sensor having a light frequency from about 500 nm to about 1000 nm, and a beam diameter from about 25 to about 75 micrometers.

3. The sensor assembly of claim 1, wherein the bias member has a spring constant between about 2.5 lbs/in and about 4.5 lbs/in.

4. The sensor assembly of claim 1, wherein the sensor is a light emitting sensor having a light frequency from about 600 nm to about 750 nm, and a beam diameter from about 25 to about 75 micrometers, and wherein the bias member has a spring constant greater than 2.75 lbs/in.

5. The sensor assembly of claim 1, further comprising:

an alignment pin having an upper end configured to contact an adjustable tuning ring, and a lower end configured to displace the bias member, wherein the edge ring is in contact with the adjustable tuning ring.

6. The sensor assembly of claim 5, wherein the contact member is disposed between the lower end of the alignment pin and the bias member.

7. The sensor assembly of claim 1, wherein the edge ring further comprises:

a first ring component; and a second ring component, wherein each of the first and second ring component form an annular body.

8. The sensor assembly of claim 1, further comprising:

a transparent window having a top face and a bottom surface, the transparent window mechanically coupled to the bottom surface of the housing, wherein the sensor is coupled to the bottom surface of the transparent window.

9. The sensor assembly of claim 1, further comprising:

a plurality of vent passages extending through the top surface of the housing into the recess.

10. The sensor assembly of claim 9, wherein the plurality of vent passages fluidically couple the recess to a same pressure as the substrate processing chamber.

11. An edge ring metric measurement system, comprising:

an edge ring disposed on a substrate support surface;

a housing having a top surface, a bottom surface opposite the top surface, and a plurality of sidewalls connecting the top surface to the bottom surface, the housing further comprising a recess in the top surface, the recess forming an interior volume within the housing;

a bias member;

a contact member disposed on the bias member, wherein the bias member and contact member are disposed within the recess;

a alignment pin mechanically contacts the edge ring and the contact member;

a light emitting sensor configured to detect a displacement of the contact member, the displacement of the contact member corresponding to a metric of the edge ring.

12. The edge ring metric measurement system of claim 11, wherein the light emitting sensor has a light frequency from about 500 nm to about 1000 nm, and a beam diameter from about 25 to about 75 micrometers.

13. The edge ring metric measurement system of claim 11, wherein the bias member has a spring constant between about 2.5 lbs/in and about 4.5 lbs/in.

14. The edge ring metric measurement system of claim 11, wherein the light emitting sensor has a light frequency from about 600 nm to about 750 nm, and a beam diameter from about 25 to about 75 micrometers, and wherein the bias member has a spring constant greater than 2.75 lbs/in.

15. The edge ring metric measurement system of claim 11, wherein the alignment pin further comprises:

an upper end configured to contact an adjustable tuning ring, and a lower end configured to displace the bias member, and wherein the contact member is disposed between the bottom surface of the alignment pin and the bias member, wherein the edge ring is in contact with the adjustable tuning ring.

16. The edge ring metric measurement system of claim 11, further comprising:

a plurality of vent passages extending through the top surface of the housing into the recess.

17. A semiconductor processing system, comprising:

a processing chamber configured to process a substrate;

a housing having a top surface and a recess in the top surface, the recess forming an interior volume within the housing;

a bias member;

a contact member disposed on the bias member, wherein the bias member and contact member are disposed within the recess;

a sensor configured to detect a displacement of the contact member, the displacement of the contact member corresponding to a relative position of an edge ring; and a non-transitory computer readable medium storing instructions, the instructions when executed by a processor cause a method to be performed in the processing chamber, the method comprising:

receiving a signal at the sensor, the signal emanating below a substrate support surface configured to have the edge ring disposed thereon, the edge ring configured to circumscribe the substrate;

detecting a displacement of the edge ring;

calculating a metric of the edge ring based upon the displacement; and performing a maintenance operation on the edge ring in response to the metric.

18. The semiconductor processing system of claim 17, wherein the metric is a weight of the edge ring.

19. The semiconductor processing system of claim 18, wherein the maintenance operation comprises:

adjusting a vertical height of the edge ring.

20. The semiconductor processing system of claim 18, wherein the metric corresponds to an amount of edge ring erosion.

* * * * *